United States Patent [19]
Blinne et al.

[11] Patent Number: 5,274,568
[45] Date of Patent: Dec. 28, 1993

[54] METHOD OF ESTIMATING LOGIC CELL DELAY TIME

[75] Inventors: Richard D. Blinne; Richard J. Holzer, Jr., both of Fort Collins; Timothy R. Ouellette, Greeley; Rhea R. Ozman, Fort Collins; Richard A. Laubhan, Fort Collins; John Scott, Fort Collins, all of Colo.

[73] Assignee: NCR Corporation, Dayton, Ohio

[21] Appl. No.: 623,310

[22] Filed: Dec. 5, 1990

[51] Int. Cl.⁵ .............................................. G06F 15/60
[52] U.S. Cl. ..................... 364/489; 364/490
[58] Field of Search ............... 364/488, 489, 490, 578, 364/569; 395/500; 307/601, 605

[56] References Cited
U.S. PATENT DOCUMENTS

| | | | |
|---|---|---|---|
| 3,784,907 | 1/1974 | Eichelberger | 364/488 |
| 4,063,080 | 12/1977 | Eichelberger et al. | 364/490 |
| 4,698,760 | 10/1987 | Lembach et al. | 364/488 |
| 4,916,388 | 4/1990 | Sano | 364/488 |
| 4,916,627 | 4/1990 | Hathaway | 364/488 |
| 5,051,911 | 9/1991 | Kimura et al. | 364/489 |
| 5,077,676 | 12/1991 | Johnson et al. | 364/489 |
| 5,168,455 | 12/1992 | Hooper | 364/489 |

Primary Examiner—Jack B. Harvey
Assistant Examiner—Ellis B. Ramirez
Attorney, Agent, or Firm—Gregory A. Welte

[57] ABSTRACT

A method for approximating the delay time of an excitation through a logic cell using the summation of a base delay, which is a function of delay coefficients for the cell and the total output load capacitance of the cell, and a rise/fall time correction, which is determined from the output rise/fall time of the driving cell and the sensitivity of the analyzed cell to rise/fall time. Other corrections/compensating factors include a performance derating factor which accounts for the multiplicative effects of operating voltage, temperature and process.

24 Claims, 3 Drawing Sheets

METHOD OF ESTIMATING LOGIC CELL DELAY TIME

BACKGROUND OF THE INVENTION

1. Field of the Invention

The present invention relates to methods of estimating the delay times associated with integrated circuit logic cells and, in particular, to methods of emulating the delay time associated with individual cells and interconnected arrays of cells, such as those in ASIC (application specific integrated circuit) arrays, including cell libraries.

2. Description of Related Art

To our knowledge, in the prior art typically the delay times of integrated circuit logical cells are estimated or emulated by multiplying the total capacitive load at the output pin(s) of a given cell and a coefficient associated with the operating characteristics specific to that type of cell. However, the resulting product is a relatively rough estimate of the actual delay time. Furthermore, the time delay errors associated with individual cells are cumulative. That is, the error associated with the estimated time delay through an interconnected array of logical cells is the sum of the emulation errors associated with the individual logic cells.

SUMMARY OF THE INVENTION

1. Objects

It is an object of the present invention to provide a method of estimating logic cell delay times which provides a more accurate estimate of the actual delay time than is available using prior art techniques.

It is a related object to provide logic cells which are characterized by accurately estimated delay times.

2. Summary

In one aspect, our invention which achieves the above objectives is embodied in a process for designing and/or designing and fabricating an integrated circuit using a cell library, and comprises the steps of: determining an initial cell design; emulating the delay time for the initial cell design; further developing the cell design; and, prior to fabricating an integrated circuit containing the cell, emulating the delay time for the developed cell. Each emulation step comprises determining an edge delay base factor which approximates the delay time of at least the rising edge or the falling edge of a signal through the logic cell; calculating an edge delay correction factor based substantially upon the slew rate of the signal applied to at least one input pin of the cell; and adding the edge delay base factor to the corresponding edge delay correction factor.

In more specific aspects, the edge delay correction factor is based substantially upon said slew rate and upon the capacitance load at an output pin of the cell, or is based upon said slew rate and said capacitance load and further upon the delay path traversed by the signal.

In another aspect, our present invention which achieves the above and other objectives is embodied in a method for determining the delay time of a signal through a logic cell which interfaces with one or more logic cells at the input and output thereof, by calculating a base delay component approximating the delay time of a signal through a logic cell which includes at least one input pin and at least one output pin, said base delay time component being based upon the capacitive load associated with said output pin; calculating a correction component based substantially upon the slew rate of a simulated signal applied to said input pins; and adding the correction component to the base delay time.

In another aspect, our invention is embodied in a method for estimating the delay time of a signal through a logic cell which interfaces with one or more other logic cells, by determining a base delay component approximating the delay time of a signal through a logic cell which includes at least one input pin and at least one output pin, said base delay time component being based upon the capacitive load associated with said output pin; and adding to the base delay time component a correction component calculated based substantially upon the slew rate of a simulated signal applied to said input pins, or upon the slew rate and the capacitance load at said output pin, or upon the slew rate and capacitance load at said output pin and the delay path through the cell.

The base delay component may be a predetermined factor which approximates the delay time of a signal through the cell from said input pin to said output pin or, alternatively, may be calculated for the specific cell.

BRIEF DESCRIPTION OF THE DRAWING

The above and other aspects of the invention are described with respect to the drawing, in which.

DETAILED DESCRIPTION OF THE PREFERRED EMBODIMENT(S)

Figure 3:
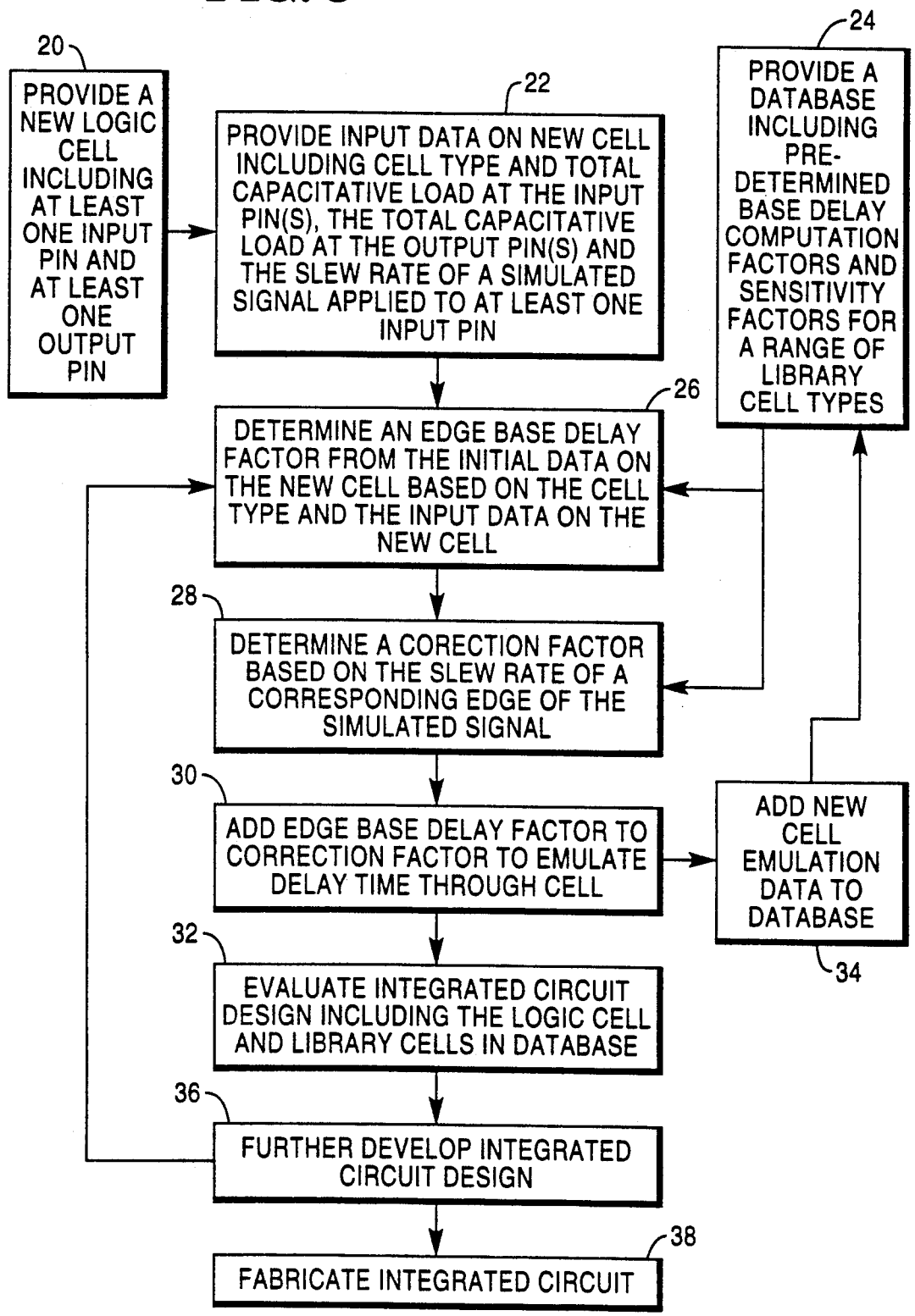
FIG. 3 is a flowchart schematically illustrating method steps in accordance with the present invention.

Referring not to FIG. 3, during a library cell development process modified in accordance with our invention, each type of cell is characterized using linear empirical equations based upon the performance of actual/standard cells and these characteristics are stored in a data (step 24) base. During the initial design of a particular integrated circuit, an emulation program, described below, uses coefficients from the data base as input to the algorithms described here and estimates the cell delay time. The cell delay tim (step 26, 28, and 30) and the other delay times for the circuit are used to verify the circuit performance for specified input/output conditions (step 32). Later in the design phase, when the design has been developed further and more precise design parameters are available, the emulation program is applied again (step 36), using this expanded information (step 34), to verify that the cell still meets the delay time performance criteria. The two delay time emulations ensure that the cell closely matches the cell library performance criteria throughout the cell development process and, thus that the cell will meet the performance criteria when the circuit is fabricated using MOS, CMOS, etc., integrated circuit fabrication techniques (step 38).

Figure 1:
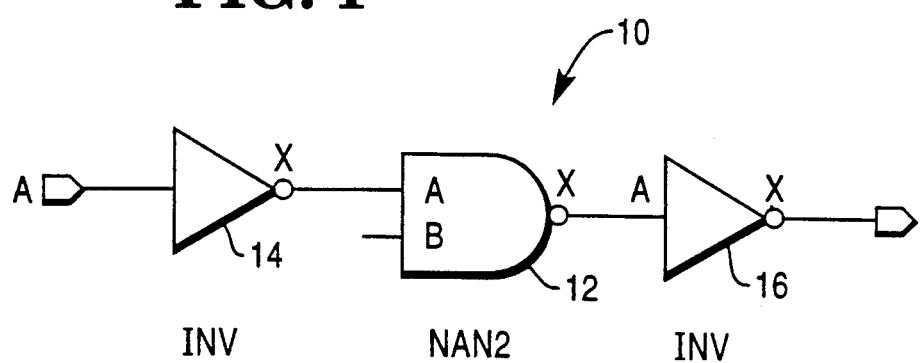
FIG. 1 schematically depicts a representative cell interconnection array to which our delay time emulation method applies.

FIG. 1 schematically depicts a representative cell array 10, including an exemplary logic cell 12 for which it is desired to estimate a delay time that accurately models the actual delay time for an excitation signal along a given path through the cell from input to output. The estimated delay times for individual cells are used by designers to predict the overall delay time for the associated cells and thereby determine whether or not the delay time is within specifications or otherwise suitable for the given circuit. Delay time emulation is useful in general in designing all type of integrated circuits and, in particular, in designing ASIC's using cell libraries.

Referring further to FIG. 1, the illustrated current logic cell 12 is a NAND cell comprising a pair of input pins A,B and an output pin X. A driving cell 14 is connected to the input side of cell 12 and a driven cell 16 is connected to the output side. Both the driving cell 14 and the driven cell 16 are INVERTERS which have input pin A and output pin X. The illustrated array 10 and the particular type of cell 12 are given by way of example only and are in no sense limiting. Rather, the present methodology is designed to provide accurate delay time simulations for any type of logic cell.

1. OVERALL DELAY TIME FORMULATION

As indicated previously, the delay time is the time required for a given excitation to propagate through a cell such as 12, FIG. 1, along a given propagation path between a given I/0 pin pair. Illustratively, the delay path is between input A and output X of cell 12.

According to our invention, accurate emulation of the delay time, tpC, is obtained by adding two estimated components, a base delay time, tp, derived from the prior art (see FIG. 3, step 26), and a correction factor tC: tpC = tp+tC (see FIG. 3, step 28).

Typically the leading and trailing edges of a given output pulse may have different delay times for propagation along a given path through a cell. Thus, the delay time calculation tpC=tp+tC is made separately for the rising and falling edges of the output. The notation and the corresponding equation for the rising edge (of the output) delay time are, $$tpLHC = tpLH + tLHC,$$

while those for the falling edge (of the output) delay time equations are, $$tpHLC = tpHL + tHLC.$$

Where the delay path is independent, i.e., the delay path is from an input pin to an output pin of the current cell, only one set of delay times is required (single rising edge delay time and falling edge delay time). However, where the propagation delay path is dependent upon another pin, a master pin, two sets of delay times are calculated: the delay time (both the rise delay time and the fall delay time) (1) from the input pin to the master pin and (2) from the master pin to the output pin.

2. BASE DELAY COMPONENT, toLH/toHL

Our delay time emulation incorporates a base component tp (tpLH or tpHL), which is a function of the operating characteristics specific to the type of current cell (INVERTER, AND, NAND, etc.) and the total capacitive load at the output pin(s) of the current cell, and which is specially modified to account for the multiplicative effects of operating voltage, temperature and process on performance. For the rising edge output, tp is given by $$tpLH = (PDE_1 + PDE_2 * CL_{OUT}) * DF_n,$$

and for the falling edge output $$tpHL = (PDE_3 + PDE_4 * CL_{OUT}) * DF_n.$$

where
$PDE_i$ is a set of linear equation coefficients determined during development of the cell library which are specific to the current delay path under analysis;

$CL_{OUT}$ is the total capacitive load on the output net of the current cell under analysis, and is the sum of all cell input capacitances due to fanout and all output capacitances (excluding the output capacitance associated with the current output pin), namely any tristate output capacitance and either the estimated prelayout capacitance or the actual post-layout capacitance; and $DF_n$ is the total propagation delay derating factor of the current cell which is the product of process, temperature, and voltage scaling factors for a particular set of conditions.

3. CORRECTION COMPONENT, tC

The correction component enhances the accuracy of the delay time estimates. Specifically, the correction component tC accounts for the effect of the rise time and the fall time, of the excitation entering the cell through the input pin(s) on the total delay through the delay path.

(a) Correction Component Element

The Correction Components: (1) an Input Rise/Fall Time Sensitivity Factor (MCLH, MCHL); (2) an Input Rise/Fall Time (trise, tfall, tactive_edge); and (3) a standard Rise/Fall Time (krise, kfall).

(1) Sensitivity Factor. The input rise/fall time sensitivity factor (MCLH, MCHL) measures the effect of the slew rate of a signal traversing the output pin of the driving cell 14 and subsequently the input pin of the current cell. In one embodiment, 15 the component comprises two coefficients for each cell delay path, determined at library formation.

Alternatively, the sensitivity factor may be a non-linear function of load capacitances or input rise/fall times. By characterizing cell behavior over a wide range of capacitive loading conditions and input slew rates, a piece-wise linear model may be applied. The associated file of multiple coefficients contains a list of delay coefficients corresponding to a table of characterization points (see Table 1). The number of characterized points covers i load capacitance ($C_L$) and j+1 input rise/fall time ($T_{rf}$) values. The length of the associated table such as Table 1 is i times j for each delay transition (NDLH and NDHL). The longer 2the table length (requiring more cell simulations during library characterization), the more accurate the delay model.

TABLE 1

| A11 | B11 | MC11 | ( | C1 | C2 | T1 | T2 | ) |
|-----|-----|------|---|----|----|----|----|---|
| A21 | B21 | MC21 | ( | C2 | C3 | T1 | T2 | ) |
| . | . | . | | . | . | . | . | |
| . | . | . | | . | . | . | . | |
| . | . | . | | . | . | . | . | |
| Ai1 | Bi1 | MCi1 | ( | Ci | Ci + 1 | Ti | T2 | ) |
| A12 | B12 | MC12 | ( | Ci | C2 | T2 | T3 | ) |
| A22 | B22 | MC22 | ( | C2 | C3 | T2 | T3 | ) |
| . | . | . | | . | . | . | . | |
| . | . | . | | . | . | . | . | |
| Aij | Bij | MCij | | Ci | (Ci + 1 | Tj | Tj + 1) | |

The delay algorithm for given $C_L$ and $T_{rf}$ with $C_m <= C_L <= C_{m+1}$ and $T_n < T_{rf} <= T_{n+1}$ (where m is between 1 and i and n is between 1 and j+1) is:

$$tpLHC^* = tpLH^* + MAX[0, tLHC^*]$$

where $$tpLH^* = [a_{mn} + b_{mn}(C_L - C_m)]$$

and $$MAX[0, tLHC^*] = MAX[0, (mc_{mn} + (mc_{m+1,n} - mc_{mn})(C_L - C_m) / (C_{m+1} - C_m))(T_{rf} - T_n)].$$

and:

The asterisks (*) indicate that there are piece-wise linear components;

$a_{mn}$ is the region intrinsic delay;

$b_{mn}$ is the delay slope versus capacitance on the $T_n$ segment;

$C_L$ is the total load capacitance on the out_pin of the cell;

$C_m$ is the load capacitance on the left region edge;

$C_{m+1}$ is the load capacitance on the right region edge;

$mc_{mn}$ is the sensitivity factor on the left region edge;

$mc_{m+1,n}$ is the sensitivity factor on the right region edge;

$T_{rf}$ is the input rise/fall time on the in_pin of the cell;

$T_n$ is the base rise/fall time characterized delay; and the parenthetical expression following the summation sign (+) is the piece-wise linear sensitivity factor.

Please note, the capacitive load difference ($C_L - C_m$) in the base delay is required to accommodate the piece-wise linear nature of the delay coefficients.

Figure 2:
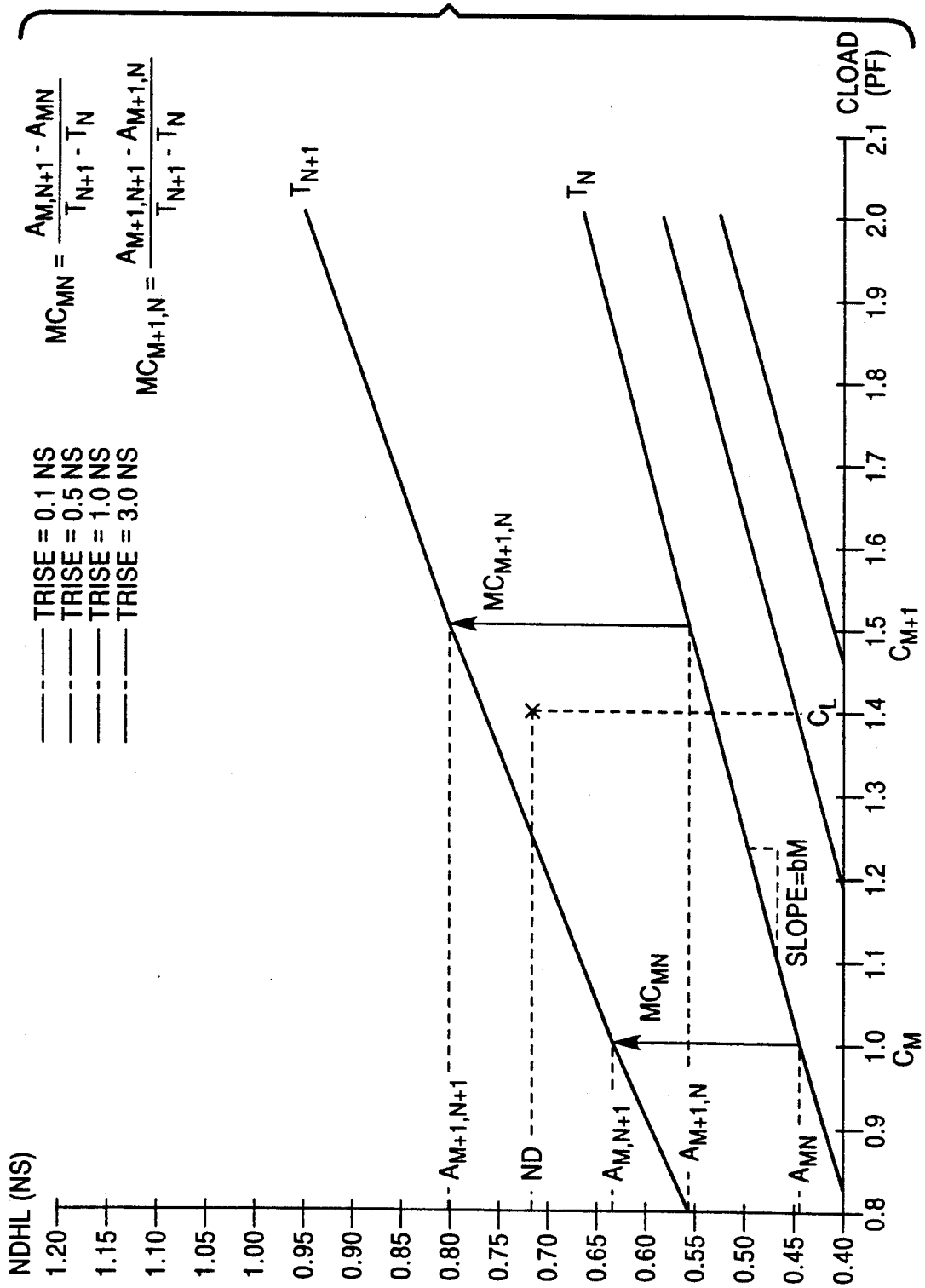
FIG. 2 graphically depicts representative coefficients used in one embodiment of our invention.

The above coefficients are shown in FIG. 2.

(2) Input Rise/Fall Time. The elements trise, tfall, tactive_edge are dependent upon the capacitance load at the input pin of the current cell and determined by substituting coefficients into a linear equation similar to that of the base delay:

| | |
|---|---|
| trise | = Rise Time at Output of Driving Cell |
| | = $(RFC_1 + RFC_2 * CL_{IN}) * DF_{n-1}$; |
| tfall | = Fall Time at Output of Driving Cell |
| | = $(RFC_3 + RFC_4 * CL_{IN}) * DF_{n-1}$; | where $RFC_1$ are linear equation coefficients determined during library development which are specific to the output pin of the driving cell;

$CL_{IN}$ is the total capacitive load on the output net of the driving Cell and comprises all cell input capacitances, and all output capacitances (excluding the output capacitance associated with the current output pin); and $DF_{n-1}$ is a total propagation delay derating factor of the driving Cell and is the product of the process, temperature, and voltage scaling factors for a particular set of conditions.

(3) Standard Rise/Fall Time. The standard rise/fall time component (krise, kfall) minimizes the effect of using the rise/fall times of a non-ideal signal used in characterization with older modeling technologies. This component enables compatibility with older technologies, and is denoted "krise" (rising edge), and "kfall" (falling edge).

(b) Path Transition Types

The correction component incorporates coefficients which are dependent upon the transition of the signal along a delay path of the current cell (for example, if the signal traversing the output pin is an inversion of the same signal when it entered the input pin, the transition is an inversion). There are three standard transitions and six non-standard transition. These transitions and the associated correction factors (defined in terms of the transitions and the above-described components) are as follows:

(1) Non-inverting (standard) The rising edge of the output corresponds to the rising edge of the input, and the falling edge of the output corresponds to the falling edge of the input:

$$tLHC = MCLH * (trise - krise); \text{ and}$$

$$tHLC = MCHL * (tfall - kfall).$$

(2) Inverting (standard) The rising edge of the output corresponds to the falling edge of the input, and the falling edge of the output corresponds to the rising edge of the input:

$$tLHC = MCLH * (tfall - kfall); \text{ and}$$

$$tHLC = MCHL * (trise - krise).$$

(3) "Either" (standard) No simple correspondence exists between input and output edges, that is, the rising and falling edges of the output may correspond to either the rising edge or the falling edge of the input:

| |
|---|
| $tLHC = MCLH * (tactive\_edge - kactive\_edge);$ and |
| $tHLC = MCHL * (tactive\_edge - kactive\_edge).$ |

(4) Rising only (non-standard) Only rising edges traverse the particular output pin(s). There is no propagation delay and no correction for the falling edge:

$$tpHLC = 0.$$

(5) Falling only (non-standard) Only falling edges traverse the particular output pin(s). There is no propagation delay and no correction for the rising edge:

$$tpLHC = 0.$$

4. SPECIFIC OVERALL DELAY TIME FORMULAS

The correction factor is determined by multiplying the Sensitivity Factor by the difference between an associated one of the Input Rise/Fall times and an associated standard Rise/Fall times and applying thereto the function MAX[a,b], which retains the highest value in the brackets and disregards the other value. For example, MAX(0,5)=5. This function is used to prevent negative correction factors.

Applying the correction factors to the corrected delay time formula provides the following expressions for the rising edge delay time and falling edge delay time:

For non-inverting paths, the equations for the total delay times are:
Rising edge $$tpLHC = tpLH + MAX[0, MCLH * (trise - krise)]$$

Falling edge $$tpHLC = tpHL + MAX[0, MCHL * (tfall - kfall)]$$

For inverting paths, the total delay times are:
Rising edge $$tpLHC = tpLH + MAX[0, MCLH * (tfall - kfall)]$$

Falling edge $$tpHLC = tpHL + MAX[0, MCHL * (trise - krise)]$$

For "either" paths

Rising edge $$tpLHC = tpLH + MAX[0, MCLH * (tactive\_edge - kactive\_edge)]$$

Falling edge
$$tpHLC = tpHL + MAX[0, MCHL * tactive\_edge - kactive\_edge)]$$

For non-standard paths:

| Rising edge only |
| --- |
| tpLHC = tpLH + tLHC |
| tpHLC = 0 |
| Falling edge only |
| tpLHC = 0 |
| tpHLC = tpHL + tHLC. |

5. SUMMARY OF METHOD

To summarize briefly, the total corrected delay time, tpC, is the summation of the base delay, tp (which is a function of operating characteristics and the total capacitive load at the output pins of the current cell), plus the correction component, tC (which is a function of the input rise/fall time sensitivity factor, the capacitive load at the input pin of the current cell, and the standard rise/fall time), tpC = tp + tC.

The overall method of selecting and calculating the delay time according to our present invention comprises the following five steps (six steps when the delay path is dependent upon a master pin):

(1) Compute the two Base Delays

Base Delay for Rising Edge $$tpLH = (PDE_1 + PDE_2 * CL_{OUT} * DF_n; \text{ and}$$

Base Delay for Falling Edge
$$tpHL = (PDE_3 + PDE_4 * CL_{OUT}) * DF_n.$$

(2) Compute one of three sets of Correction Components based on the transition a signal undergoes when it traverses the path:

(a) For a non-inverting path:

Rising Edge Correction Component
$$tLHC = MCLH * (trise - krise)$$

Falling Edge Correction Component $$tHLC = MCHL * (tfall - kfall)$$

(b) For an inverting path:
Rising Edge Correction Component $$tLHC = MCLH * (tfall - kfall)$$

Falling Edge Correction Component $$tHLC = MCHL * (trise - krise)$$

(c) For an "either" path:
Rising Edge Correction Component $$tLHC = MCLH * (tactive\_edge - kactive\_edge)$$

Falling Edge Correction Component $$tHLC = MCHL * (tactive\_edge - kactive\_edge)$$

(3). Add the Base Delays and the appropriate correction components, applying the MAX function as shown to remove negative corrections:

$$tpLHC = tpLH + MAX[0, tLHC]$$

$$tpHLC = tpHL + MAX[0, tHLC].$$

Note: For non-standard LH transitions, tpHLC = 0. For non-standard HL transitions, tpLHC = 0.

(4) Is the path dependent upon another (master) pin?

(a) If yes and if there is a rising delay from the input pin to the master pin, add to that rising delay the falling delay from the master pin to the output pin. Conversely, if there is a falling delay from the input pin to the master pin, add to that the rising delay from the master pin to the output pin.

(b) If no, then the path is independent. Only one delay time per edge has to be computed: the delay time from the input pin to the output pin.

Having thus described preferred and alternative embodiments of our invention, those of usual skill in the art will readily derive modifications thereof within the scope of the following claims.

What is claimed is:

1. A method of determinig a delay time for a signal through a logic cell having at least one input pin and at least one output pin, comprising: (1) providing input data characteristic of the logic cell, said data including cell type, total capacitive load at said at least one input pin, total capacitive load at said at leas one output pin, and slew rate of a simulated signal applied to said at least on input pin, (2) providing a database of predetermined library ell data including base delay computation facts and sensitivity factors for a range of library cell types, (3) determinig from said input data and from said predetermined library cell data at least one edge delay base factor which approximates the delay time of an associated edge of a signal through the logic cell, said associated edge associated with a corresponding edge of said simulated signal, the delay time selected from at least one of a rising edge delay time associated with the rising edge of the signal and a falling edge delay time associated with the falling edge of the signal (4) determining a correction factor based substantially on the slew rate of the corresponding edge of said stimulated signal, and (5) adding said correction factor to said base delay factor to emulate delay time through the cell.

2. The method of claim 1, wherein the rising and falling edge delay correction factors correspond to the rising and falling edges of a signal traversing a non-inverting path, and are, respectively, MAX [0, MCLH*(Trise−Krise)] and MAX [0, MCHL*(Tfall−Kfall)]; and wherein the MAX function selects the highest one of the values separated by commas and located within the square brackets; MCLH and MCHL are an input rise time sensitivity factor and an input fall time sensitivity factor, respectively, which measure the effect on the cell of the slew rate of the signal traversing the input pin of the cell; Trise and Tfall are the rise time and the fall time, respectively, at the input pin of the cell; and Krise and Kfall are the standard rise time and the standard fall time, respectively, which remove the effects of utilizing the rise and fall times of an ideal simulated signal.

3. The method of claim 2, wherein $Trise = (RFC_1 + RFC_2 * CL_{IN}) * DF_{n-1}$; $Tfall = (RFC_3 + RFC_4 * CL_{IN}) * DF_{n-1}$; and wherein $RFC_1$ through $RFC_4$ are coefficients which correspond to the rise and fall times of the signal traversing the input pin of the cell; $CL_{IN}$ is the total capacitive load on the input pin of the cell; and $DF_{n-1}$ is the total propagation delay derating factor of a cell which interfaces the cell at the input pin.

4. The method of claim 1, wherein the rising and falling edge delay correction factors which correspond to the rising and falling edges of a signal traversing an inverting path comprise, respectively, MAX [0, MCLH*(Tfall−Krise)] and MAX [0, MCHL*(Trise−Kfall)]; and wherein the MAX function selects the highest one of the values separated by commas and located within square brackets; MCLH and MCHL are the input rise time sensitivity factor and the input fall time sensitivity factor, respectively, which measure the effect on the cell of the slew rate of the signal traversing the input pin of the cell; Trise and Tfall are the rise time and the fall times, respectively, at the input pin of the cell; and Krise and Kfall are the standard rise time and standard fall time, respectively, which remove the affects of utilizing the rise and fall times of an ideal simulate signal.

5. The method of claim 4, wherein $Trise = (RFC_1 + RFC_2 * CL_{IN}) * DF_{n-1}$; $Tfall = (RFC_3 + RFC_4 * CL_{IN}) * DF_{n-1}$; and wherein $RFC_1$ through $RFC_4$ are coefficients which correspond to the rise and fall times of the signal traversing the input pin of the cell; $CL_{IN}$ is the total capacitive load on the input pin of the cell; and $DF_{n-1}$ is the total propagation delay derating factor of a cell which interfaces the cell at the input pin.

6. The method of claim 1, wherein the rising and falling edge delay correction factors which correspond to the rising and falling edges of a signal traversing an either path for which an active edge of said cell is known comprise, respectively, MAX [0, MCLH*(Tactive_edge−Krise)] and
MAX [0, MCHL*(Tactive_edge−Kfall)]; and wherein the MAX function selects the highest one of the values separated by commas and located within square brackets; MCLH and MCHL are the input rise time sensitivity factor and the input fall time sensitivity factor, respectively, which measure the effect on the cell of the slew rate of the signal traversing the input pin of the cell; Tactive_edge is the rise time and the fall time, respectively, at the active edge of the input pin of the cell; and Krise and Kfall are the standard rise time and standard fall time, respectively, which remove the effect of utilizing the rise and fall times of an ideal simulated signal.

7. The method of claim 6, wherein $Tactive\_edge = RFC_5 + RFC_6 * CL_{IN}) * DF_{n-1}$; and wherein $RFC_5$ and $RFC_6$ are coefficients which correspond to the rise and fall time of the signal traversing the input pin of the cell; $CL_{IN}$ is the total capacitive load on the input pin of the cell; and $DF_{n-1}$ is the total propagation delay derating factor of a cell which interfaces the cell at the input pin.

8. A method of determining a delay time of a signal through a logic cell which interfaces with one or more other logic cells, said logic cell having at least one input pin and at least one output pin, the method comprising the steps of:

providing input data characteristic of the logic cell, said data including cell type, total capacitive load at said at least one input pin, total capacitive load at said at least one output pin, and slew rate of a simulated signal applied to said at least one input pin;

providing a database of predetermined library cell data including base delay computation factors and sensitivity factors for a range of library cell types;

determining from said library cell data and said input data at least on edge delay base factor which approximates the delay time of the associated edge of a signal through the logic cell, said associated edge associated with a corresponding edge of said simulated signal, the delay time being selected from at least one of a rising edge time associated with the rising edge of the signal and a falling edge delay time associated with the falling edge of the signal and wherein the respective edge delay times are obtained for the associated edges of the signal;

calculating an edge delay correction factor based substantially upon the slew rate of the corresponding edge of said simulated signal applied to at least one input pin of said cell and upon the capacitance load at said at least one output pin; and adding the edge delay base factor to the corresponding edge delay correction factor to determine the delay time.

9. The method of claim 8, wherein the rising and falling edge delay correction factors which correspond to the rising and falling edges of a signal traversing a non-inverting path comprise, respectively, MAX [0, $MCLH_c$*($Trise_c$−Krise)] and MAX [0, $MCHL_c$*($Tfall_c$−Kfall)]; and wherein the MAX function selects the highest one of the values separated by commas and located within square brackets; $MCLH_c$ and $MCHL_c$ are the input rise time sensitivity factor and the input fall time sensitivity factor, respectively, which measure the effect upon said cell of the slew rate of the signal traversing the input pin of said cell and the effect of the capacitance load; $Trise_c$ and $Tfall_c$ represent the rise time and fall time, respectively, at the input pin of said cell; and Krise and Kfall are the standard rise time and the standard fall time, respectively, which remove the effects of utilizing the rise and fall times of an ideal simulated signal.

10. The method of claim 9, wherein Trise=$(RFC_{1,c}+RFC_{2,c}*CL_{IN})*DF_{n-1}$; Tfall=$(RFC_{3,c}+RFC_{4,c}*CL_{IN}))*DF_{n-1}$; and wherein $RFC_{1,c}$ through $RFC_{4,c}$ are coefficients which correspond to the rise and fall times of the signal traversing the input pin of said cell and also correspond to said capacitance load; $CL_{IN}$ is the total capacitive load the input pin of said cell; and $DF_{n-1}$ is the total propagation delay derating factor of a cell which interfaces said cell at the input pin.

11. The method of claim 8, wherein the rising and falling edge delay correction factors which correspond to the rising and falling edges of a signal traversing an inverting path comprise, respectively, MAX [0, $MCLH_c*(Tfall_c-Krise)$] and MAX [0, $MCHL_c*(Trise_c-Kfall)$]; and wherein MAX is a function which selects the highest one of the values separated by commas and located within square brackets; $MCLH_c$ and $MCHL_c$ are the input rise time sensitivity factor and the input fall time sensitivity factor, respectively, which measure the effect upon said cell of the slew rate of the signal traversing the input pin of said cell and the effect of the capacitance load; $Trise_c$ and $Tfall_c$ are the rise time and the fall time, respectively, at the input pin of said cell; and Krise and Kfall are the standard rise time and the standard fall time, respectively, which remove the effects of utilizing the rise and fall times of an ideal simulated signal.

12. The method of claim 11, wherein Trise=$(RFC_{1,c}+RFC_{2,c}*CL_{IN})*DF_{n-1}$; Tfall=$(RFC_{3,c}+RFC_{4,c}*CL_{IN})*DF_{n-1}$; and wherein $RFC_{1,c}$ through $RFC_{4,c}$ are coefficients which correspond to the rise and fall times of the signal traversing the input pin of said cell and also correspond to said capacitance load; $CL_{IN}$ is the total capacitive load the input pin of said cell; and $DF_{n-1}$ is the total propagation delay derating factor of a cell which interfaces said cell at the input pin.

13. The method of claim 8, wherein the rising and falling edge delay correction factors which correspond to the rising and falling edges of a signal traversing an either path for which an active edge of said cell is known comprise, respectively,
MAX [0, $MCLH_c*(Tactive\_edge_c-Krise)$] and
MAX [0, $MCHL_c*(Tactive\_edge_c-Kfall)$]; and wherein the MAX function selects the highest one of the values separated by commas and located within square brackets; $MCLH_c$ and $MCHL_c$ are the input rise time sensitivity factor and the input fall time sensitivity factor, respectively, which measure the effect upon said cell of the slew rate of the signal traversing the input pin of said cell and the impact of the capacitance load; $Tactive\_edge_c$ is the rise time and the fall time, respectively, at the active edge of the input pin of said cell and corresponding to said capacitance load; and Krise and Kfall are the standard rise time and the standard fall time, respectively, which remove the effects of utilizing the rise and fall times of an ideal simulated signal.

14. The method of claim 13, wherein Tactive_edge=$(RFC_{5,c}+RFC_{6,c}*CL_{IN})*DF_{n-1}$; and wherein $RFC_{5,c}$ and $RFC_{6,c}$ are coefficients which correspond to the rise and fall times of the signal traversing the input pin of said cell; $CL_{IN}$ is the total capacitive load on the input pin of said cell; and $DF_{n-1}$ is the total propagation delay derating factor of a cell which interfaces said cell at the input pin.

15. A method of determining delay time of a signal through a logic cell which interfaces with one or more other logic cells, said logic cell having at least one input pin and at least one output pin and at least one delay path, the method comprising the steps of:

providing input data characteristic of the logic cell, said data including cell type, total capacitive load at said at least one input pin, total capacitive load at said at least one output pin, and slew rate of a simulated signal applied to said at least one input pin;

providing a database of predetermined library cell data including base delay computation factors and sensitivity factors for a range of library cell types;

determinig from said library cell data and said input data an edge delay base factor which approximates the delay time of the associated edge of signal through the logic cell, said associated edge associated with a corresponding edge of said impulse signal, the delay time being selected from a t least one of a rising edge delay time associated with a rising edge of the signal and a falling edge delay time associated with a falling edge of the signal and wherein the respective edge times are obtained for the associated edges of the signal;

calculating an edge delay correction factor based substantially upon the slew rate of the corresponding edge of said simulated signal applied to at least one input pin of said cell, upon the capacitance load at said at least one output pin, and upon the delay path traversed by said signal; and adding the edge delay base factor tot he corresponding edge delay correction factors, to determine the delay time.

16. The method of claim 15, wherein the rising and falling edge delay correction factors which correspond to the rising and falling edges of a signal traversing a non-inverting path comprise, respectively, MAX [0, $MCLH_{c,d}*(Trise_{c,d}-Krise)$] and MAX [0, $MCHL_{c,d}*(Tfall_{c,d}-Kfall)$]; and wherein the MAX function selects the highest one of the values separated by commas and located within square brackets; $MCLH_{c,d}$ and $MCHL_{c,d}$ are the input rise time sensitivity factor and the input fall time sensitivity factor, respectively, which measure the effect upon said cell of the slew rate of the signal traversing said at least one input pin of said cell, the effect of said capacitance load, and the effect of said delay path traversed by said signal; $Trise_{c,d}$ and $Tfall_{c,d}$ are the rise time and the fall time, respectively, at the input pin of said cell; and Krise and Kfall are the standard rise time and the standard fall time, respectively, which remove the effects of utilizing the rise and fall times of an ideal simulated signal.

17. The method of claim 15, wherein the rising and falling edge delay correction factors which correspond to the rising and falling edges of a signal traversing a standard inverting path comprise, respectively, MAX [0, $MCLH_{c,d}*(Tfall_{c,d}-Krise)$] and MAX [0, $MCHL_{c,d}*(Trise_{c,d}-Kfall)$]; and wherein the MAX function selects the highest one of the values separated by commas and located within square brackets; $MCLH_{c,d}$ and $MCHL_{c,d}$ are the input rise time sensitivity factor and the input fall time sensitivity factor, respectively, which measure the effect upon said cell of the slew rate of the signal traversing the input pin of said cell, the effect of said capacitance load, and the effect of said delay path traversed by said signal; $\text{Trise}_{c,d}$ and $\text{Tfall}_{c,d}$ are the rise time and the fall time, respectively, at the input pin of said cell; and Krise and Kfall are the standard rise time and the standard fall time, respectively, which remove the effects of utilizing the rise and fall times of an ideal simulated signal.

18. The method of claim 15, wherein the rising and falling edge delay correction factors which correspond to the rising and falling edges of a signal traversing a standard either path for which an active edge of said cell is known comprise, respectively, MAX [0, $\text{MCLH}_{c,d}*(\text{Tactive\_edge}_{c,d} - \text{Krise})$] and MAX [0, $\text{MCHL}_{c,d}*(\text{Tactive\_edge}_{c,d} - \text{Kfall})$]; and wherein the MAX function selects the highest one of the values separated by commas and located within square brackets; $\text{MCLH}_{c,d}$ and $\text{MCHL}_{c,d}$ are the input rise time sensitivity factor and the input fall time sensitivity factor, respectively, which measure the effect upon the cell of the slew rate of the signal traversing said at least one input pin of said cell, the effect of said capacitance load, and the effect of said delay path traversed by said signal; $\text{Tactive\_edge}_{c,d}$ are the rise time and the fall time, respectively, at the active edge of the input pin of said cell; and Krise and Kfall are the standard rise time and the standard fall time, respectively, which remove the effects of utilizing the rise and fall times of an ideal simulated signal.

19. The method of claim 16, wherein $\text{Trise} = (\text{RFC}_{1,c,d} + \text{RFC}_{2,c,d} * \text{CL}_{IN}) * \text{DF}_{n-1}$; $\text{Tfall} = (\text{RFC}_{3,c,d} + \text{RFC}_{4,c,d} * \text{CL}_{IN}) * \text{DF}_{n-}$; wherein $\text{RFC}_{1,c,d}$ through $\text{RFC}_{4,c,d}$ are coefficients which correspond to, respectively, the rise and the fall times of the signal traversing said at least one input pin of said cell, said capacitance load, and said delay path traversed by said signal; wherein $\text{CL}_{IN}$ is the total capacitive load on said at least one input pin of said cell; and wherein $\text{DF}_{n-1}$ is the total propagation delay derating factor of a cell which interfaces said cell at its said at least one input pin.

20. The method of claim 17, wherein $\text{Trise} = (\text{RFC}_{1,c,d} + \text{RFC}_{2,c,d}* \text{CL}_{IN})* \text{DF}_{n-1}$; $\text{Tfall} = (\text{RFC}_{3,c,d} + \text{RFC}_{4,c,d}*\text{CL}_{iN})*\text{DF}_{n-1}$; wherein $\text{RFC}_{1,c,d}$ through $\text{RFC}_{4,c,d}$ are coefficients which correspond to, respectively, the rise and the fall times of the signal traversing said at least one input pin of said cell, said capacitance load, and said delay path traversed by said signal; wherein $\text{CL}_{IN}$ is the total capacitive load on said at least one input pin of said cell; and wherein $\text{DF}_{n-1}$ is the total propagation delay derating factor of a cell which interfaces said cell at its said at least one input pin.

21. The method of claim 18, wherein $\text{Tactive\_edge} = (\text{RFC}_{5,c} + \text{RFC}_{6,c}*\text{Cl}_{IN})*\text{DF}_{n-1}$; wherein $\text{RFC}_{5,c,d}$ and $\text{RFC}_{6,c,d}$ are coefficients which correspond to, respectively, the rise and the fall times of the signal traversing said at least one input pin of said cell, said capacitance load, and said delay path traversed by said signal; $\text{CL}_{IN}$ is the total capacitive load on said at least one input pin of said cell; and wherein $\text{DF}_{n-1}$ is the total propagation delay derating factor of a cell which interfaces said cell at its said at least one input pin.

22. In the process of designing and fabricating an integrated circuit using a cell library, the steps of: determining an initial cell design; emulating a delay time for the initial cell design; further developing the cell design; and, prior to fabricating an integrated circuit containing the cell, emulating a delay time for the developed cell, each emulation step comprising determining an edge delay base factor which approximates the delay time of at least one of the rising edge and the falling edge of a signal through the logic cell; calculating an edge delay correction factor based substantially upon the slew rate of the signal applied to at least one input pin of the cell; and adding the edge delay base factor to the corresponding edge delay correction factor to emulate the delay time.

23. The process of claim 22, wherein the edge delay correction factor is base substantially upon said slew rate and upon the capacitance load at an output pin of the cell.

24. The process of claim 23, wherein the edge delay correction factor is based upon said slew rate and said capacitance load and further upon the delay path traversed by the signal.

* * * * *

UNITED STATES PATENT AND TRADEMARK OFFICE
CERTIFICATE OF CORRECTION

PATENT NO. : 5,274,568
DATED : December 28, 1993
INVENTOR(S) : Richard D. Blinne et al.

It is certified that error appears in the above-indentified patent and that said Letters Patent is hereby corrected as shown below:

Column 8, Line 53, "leas" should be --least--.

Column 8, Line 56, "ell" should be --cell--.

Column 8, Line 57, "facts" should be --factors--,

Column 8, Line 58, "determinig" should be --determining--.

Column 8, Line 68, "stimulated" should be --simulated--.

Column 9, Line 47, "simulate" should be --simulated--.

Column 10, Line 12, "time" should be --times--.

Column 12, Line 18, delete "impulse" and insert --simulated--.

Column 12, Line 31, delete "tot he" and insert instead --to the--.

Column 13, Line 32, after "$Df_{n-}$" insert --$_1$--.

Column 14, Line 11, delete "*$Cl_{IN}$" and insert --*$CL_{IN}$--.

UNITED STATES PATENT AND TRADEMARK OFFICE
CERTIFICATE OF CORRECTION

PATENT NO. : 5,274,568

DATED : December 28, 1993

INVENTOR(S) : richard D. Blinne et al

It is certified that error appears in the above-indentified patent and that said Letters Patent is hereby corrected as shown below:

Column 14, Line 37, "base" should be --based--.

Signed and Sealed this

Thirtieth Day of August, 1994

Attest:

BRUCE LEHMAN

Attesting Officer     Commissioner of Patents and Trademarks